United States Patent
Nagel et al.

(10) Patent No.: US 12,532,665 B2
(45) Date of Patent: Jan. 20, 2026

(54) METHOD OF FABRICATING A MAGNETORESISTIVE BIT FROM A MAGNETORESISTIVE STACK

(71) Applicant: Everspin Technologies, Inc., Chandler, AZ (US)

(72) Inventors: Kerry Joseph Nagel, Scottsdale, AZ (US); Sanjeev Aggarwal, Scottsdale, AZ (US); Sarin A. Deshpande, San Jose, CA (US)

(73) Assignee: Everspin Technologies, Inc., Chandler, AZ (US)

( * ) Notice: Subject to any disclaimer, the term of this patent is extended or adjusted under 35 U.S.C. 154(b) by 287 days.

(21) Appl. No.: 18/484,202

(22) Filed: Oct. 10, 2023

(65) Prior Publication Data
US 2024/0049607 A1    Feb. 8, 2024

Related U.S. Application Data

(63) Continuation of application No. 17/109,318, filed on Dec. 2, 2020, now abandoned, which is a continuation of application No. 16/881,151, filed on May 22, 2020, now Pat. No. 10,886,463, which is a continuation of
(Continued)

(51) Int. Cl.
| | |
|---|---|
| *H10N 50/01* | (2023.01) |
| *G11C 11/16* | (2006.01) |
| *H10N 50/10* | (2023.01) |
| *H10N 50/80* | (2023.01) |
| *H10N 50/85* | (2023.01) |

(52) U.S. Cl.
CPC .......... *H10N 50/01* (2023.02); *G11C 11/161* (2013.01); *H10N 50/10* (2023.02); *H10N 50/80* (2023.02); *H10N 50/85* (2023.02)

(58) Field of Classification Search
CPC ......... H10B 61/00; H10B 61/10; H10N 50/80
See application file for complete search history.

(56) References Cited

U.S. PATENT DOCUMENTS

| | | | |
|---|---|---|---|
| 7,183,120 B2 * | 2/2007 | Berg | H01F 41/308 |
| | | | 257/E21.208 |
| 7,976,715 B2 | 7/2011 | Dobisz et al. | |
| 8,003,236 B2 | 8/2011 | Albrecht et al. | |

(Continued)

OTHER PUBLICATIONS

International Preliminary Report on Patentability and Written opinion issued in International Application No. PCT/US2018/047524, issued Dec. 3, 2018 (14 pages).

*Primary Examiner* — Evren Seven
(74) *Attorney, Agent, or Firm* — Bookoff McAndrews PLLC

(57) ABSTRACT

A method of fabricating a magnetoresistive bit from a magnetoresistive stack includes (a) etching through at least a portion of a thickness of the surface region to create a first set of exposed areas in the form of multiple strips extending in a first direction, and (b) etching through at least a portion of a thickness of the surface region to create a second set of exposed areas in the form of multiple strips extending in a second direction. The first set of exposed areas and the second set of exposed areas may have multiple areas that overlap. The method may also include, (c) after the etching in (a) and (b), etching through at least a portion of the thickness of the magnetoresistive stack through the first set and second set of exposed areas.

20 Claims, 9 Drawing Sheets

Related U.S. Application Data application No. 16/108,762, filed on Aug. 22, 2018, now Pat. No. 10,700,268.

(60) Provisional application No. 62/551,400, filed on Aug. 29, 2017.

(56) References Cited

U.S. PATENT DOCUMENTS

| | | |
|---|---|---|
| 8,686,484 B2 | 4/2014 | Whig et al. |
| 8,747,680 B1 | 6/2014 | Deshpande et al. |
| 9,136,464 B1 | 9/2015 | Whig et al. |
| 9,419,208 B2 | 8/2016 | Whig et al. |
| 10,700,268 B2 | 6/2020 | Nagel et al. |
| 10,886,463 B2 | 1/2021 | Nagel et al. |
| 2007/0155027 A1* | 7/2007 | Ditizio .................. H10N 50/01 257/E43.006 |
| 2008/0242074 A1* | 10/2008 | Lee ....................... H10B 69/00 257/E21.179 |
| 2009/0256221 A1 | 10/2009 | Mei et al. |
| 2010/0240151 A1 | 9/2010 | Belen et al. |
| 2010/0248491 A1* | 9/2010 | Sun .................... H01L 21/0338 438/717 |
| 2011/0076784 A1 | 3/2011 | Druist et al. |
| 2013/0052752 A1 | 2/2013 | Satoh et al. |
| 2013/0244344 A1 | 9/2013 | Malmhall et al. |
| 2014/0070342 A1 | 3/2014 | Sandhu et al. |
| 2014/0217527 A1 | 8/2014 | Guo |
| 2014/0264516 A1 | 9/2014 | Seo et al. |
| 2016/0204342 A1 | 7/2016 | Hayashi et al. |
| 2016/0351791 A1 | 12/2016 | Zou et al. |
| 2017/0005260 A1 | 1/2017 | Annunziata et al. |
| 2019/0189914 A1 | 6/2019 | Miyazoe et al. |

\* cited by examiner

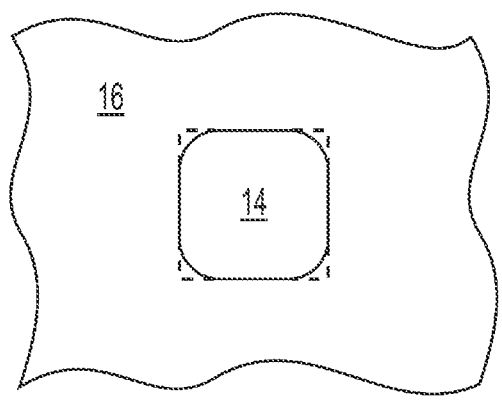
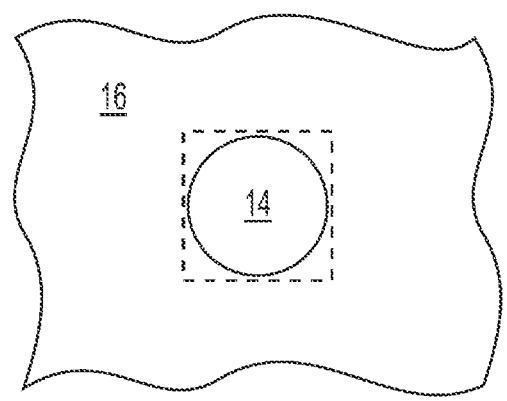
FIG. 7A  FIG. 7B
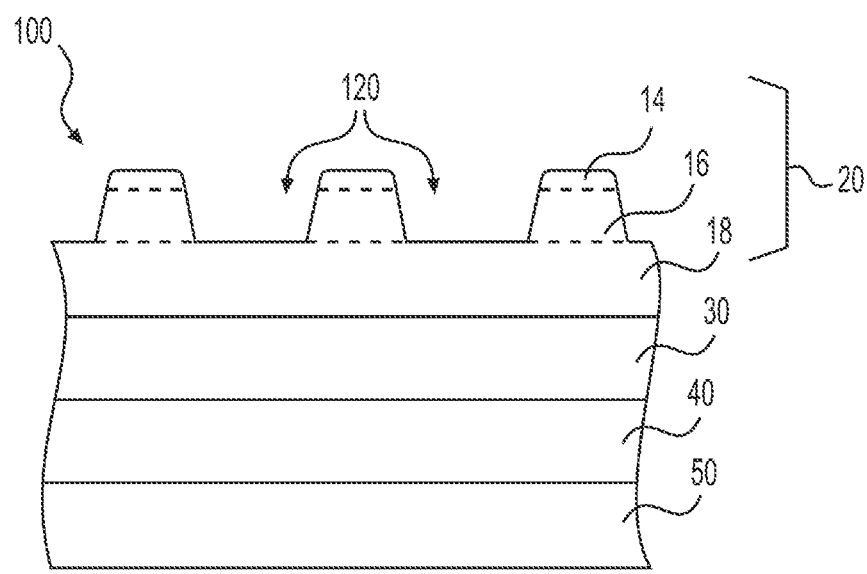
FIG. 8

METHOD OF FABRICATING A MAGNETORESISTIVE BIT FROM A MAGNETORESISTIVE STACK

CROSS-REFERENCE TO RELATED APPLICATIONS

This application is a continuation of and claims the benefit of priority to U.S. Non-Provisional application Ser. No. 17/109,318, filed on Dec. 2, 2020, which claims the benefit of priority to U.S. Non-Provisional application Ser. No. 16/881,151, filed May 22, 2020, now U.S. Pat. No. 10,886,463, issued Jan. 5, 2021, which is a continuation of and claims the benefit of priority to U.S. Non-Provisional Application Ser. No. 16/108,762, filed Aug. 22, 2018, now U.S. Pat. No. 10,700,268, issued Jun. 30, 2020, which claims the benefit of U.S. Provisional Application No. 62/551,400, filed Aug. 29, 2017, the disclosures of which are incorporated herein by reference in their entireties.

TECHNICAL FIELD

The present disclosure relates to, among other things, embodiments and aspects related to manufacturing integrated circuit devices and the devices resulting therefrom.

INTRODUCTION

There are many inventions described and illustrated herein, as well as many aspects and embodiments of those inventions. In one aspect, the present disclosure relates to methods of manufacturing an integrated circuit device and the devices resulting therefrom. To describe aspects of the disclosed method, an exemplary method of manufacturing a magnetoresistive device (for example, a magnetoresistive memory, a magnetoresistive sensor/transducer, etc.) from a magnetoresistive stack/structure is described herein. However, this is only exemplary, and the disclosed method can be applied to manufacture any integrated circuit device.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments. For ease of illustration, the figures depict the different regions along the thickness of the illustrated magnetoresistive stacks as a layer having well defined boundaries (i.e., depicted using lines). However, one skilled in the art would understand that, in reality, at an interface between adjacent regions or layers, the materials of these regions may alloy together, or migrate into one or the other material, and make their boundaries ill-defined or diffuse. That is, although multiple layers with distinct interfaces are illustrated in the figures, in some cases, over time and/or exposure to high temperatures, materials of some of the layers may migrate into or interact with materials of other layers to present a more diffuse interface between these layers. Further, although the figures illustrate each region or layer as having a relatively uniform thickness across its width, a skilled artisan would recognize that, in reality, the different regions may have a non-uniform thickness (e.g., the thickness of a layer may vary along the width of the layer).

In the figures and description, details of well-known features (e.g., interconnects, etc.) and manufacturing techniques (e.g., deposition techniques, etching techniques, etc.) may be omitted for the sake of brevity (and to avoid obscuring other features), since these features/technique are well known to a skilled artisan. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing dimensional relationships between different regions/layers. Moreover, while certain regions/layers and features are illustrated with straight 90-degree edges, in reality, such regions/layers may be more "rounded" and/or gradually sloping. It should also be noted that, even if it is not specifically mentioned, aspects described with reference to one embodiment may also be applicable to, and may be used with, other embodiments.

Figure 2:
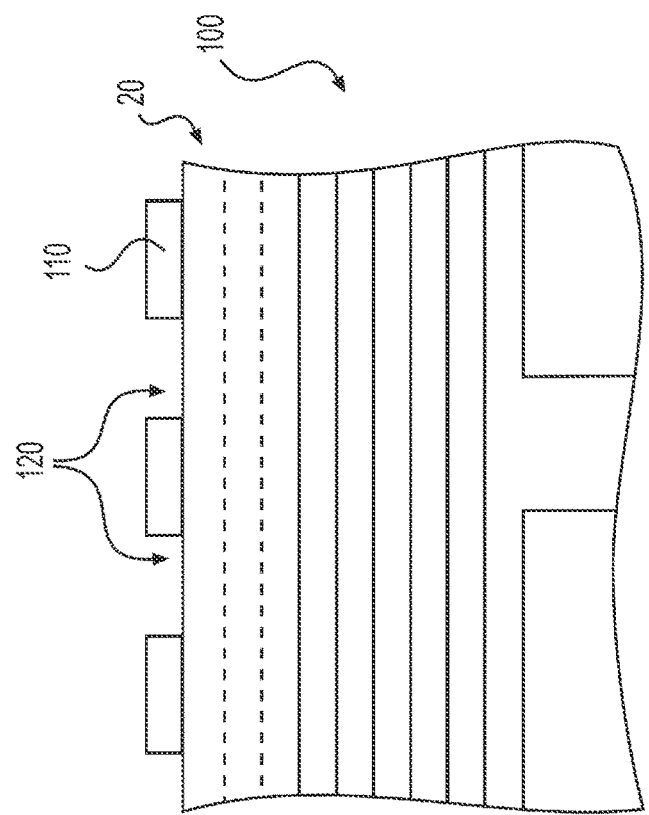
Figure 1:
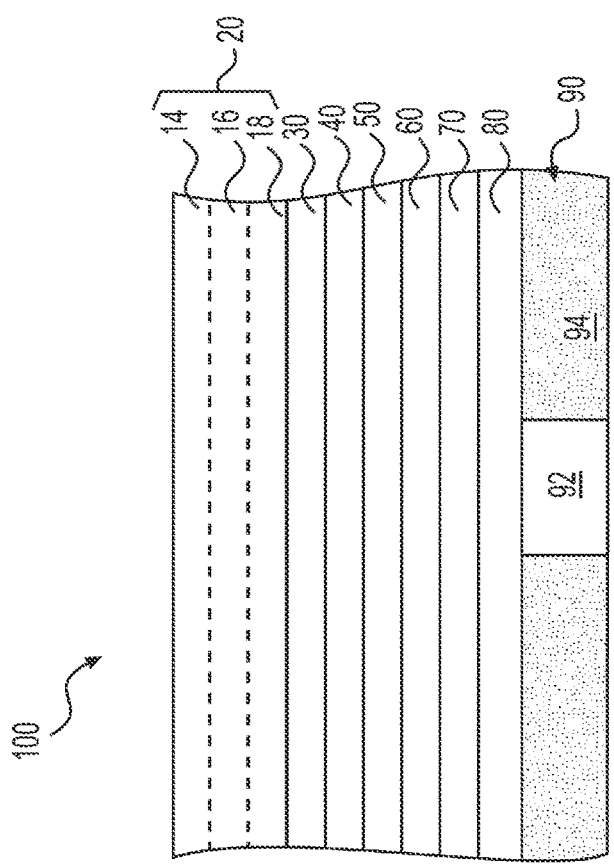
Figure 3:
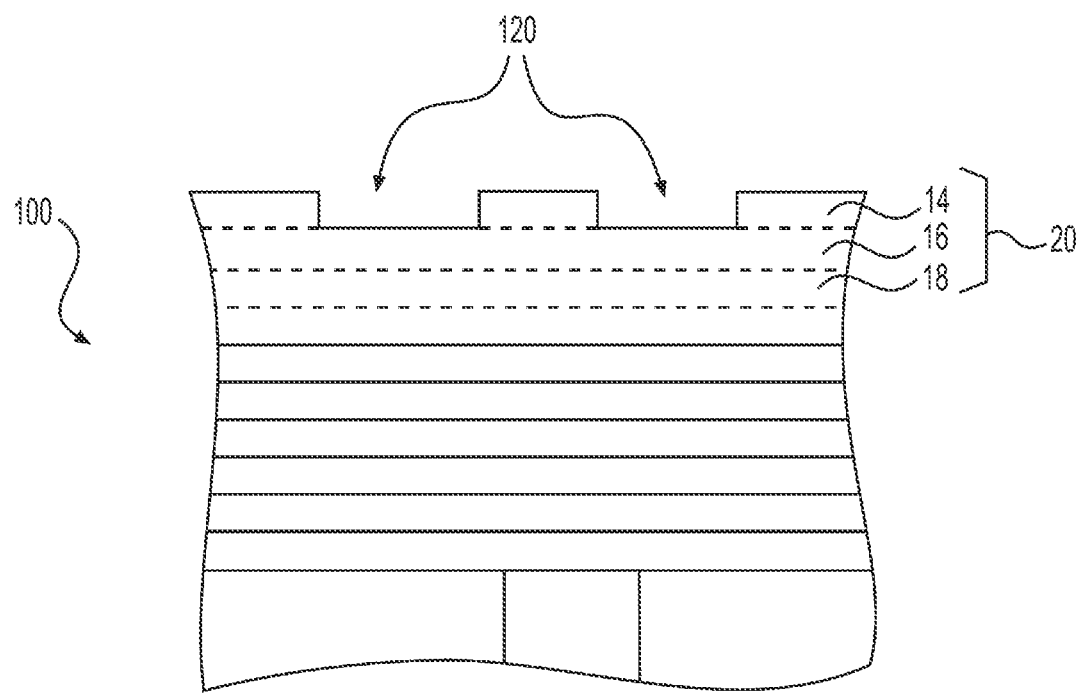
Figure 4:
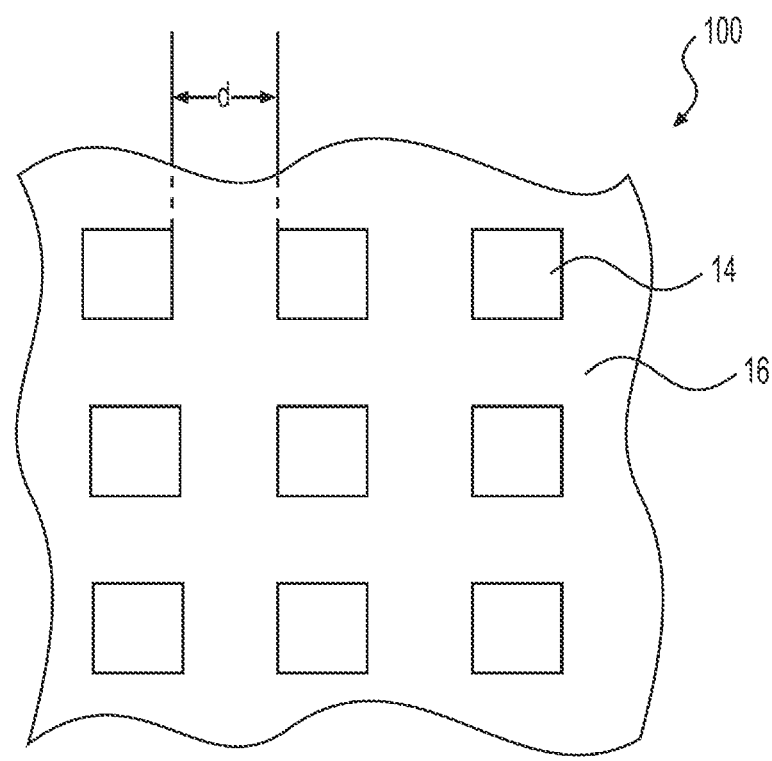
Figure 5A:
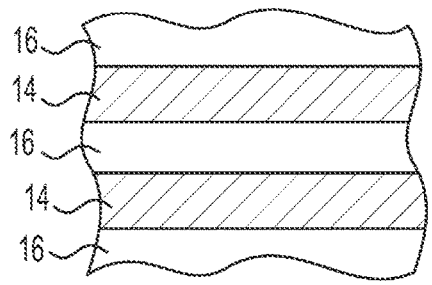
Figure 5B:
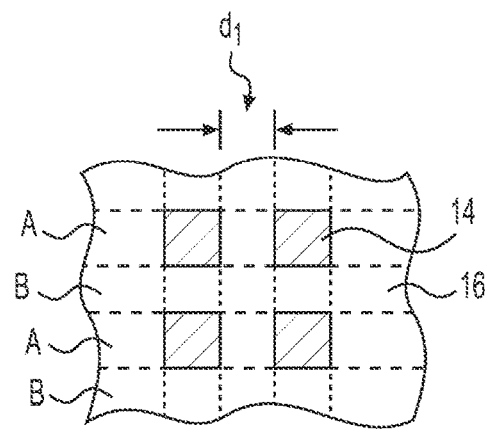
Figure 9:
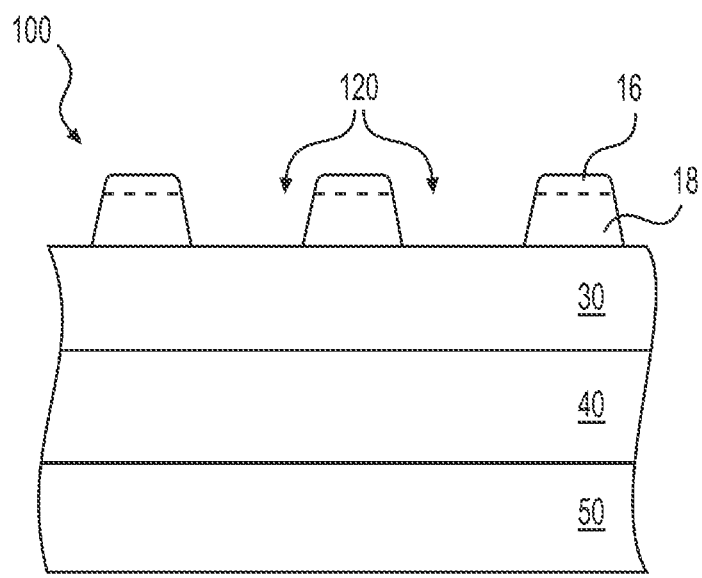
Figure 10:
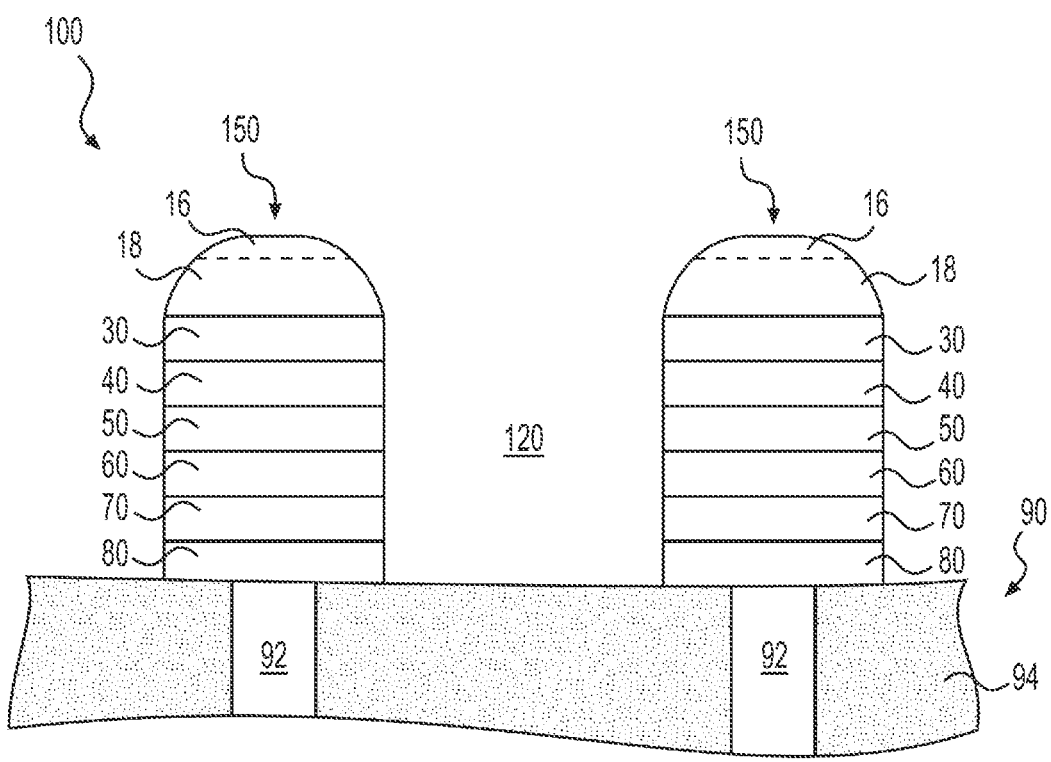
Figure 11:
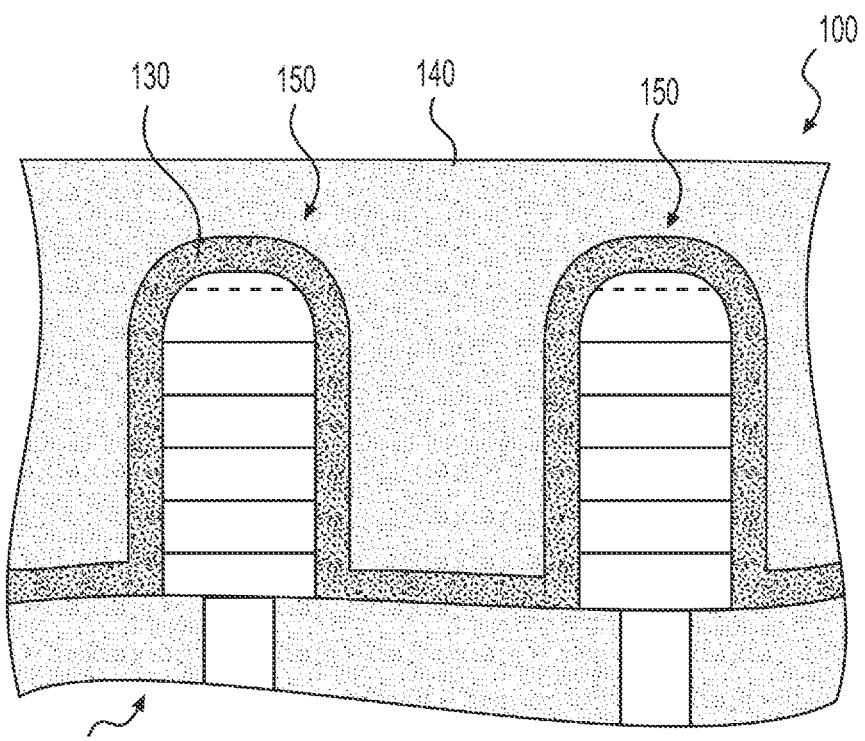
Figure 12:
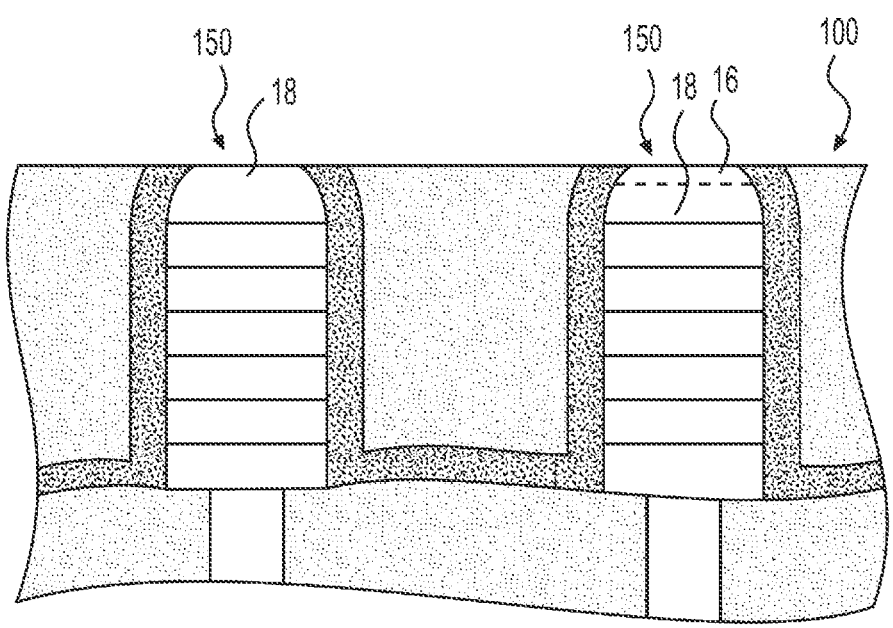
Figure 13:
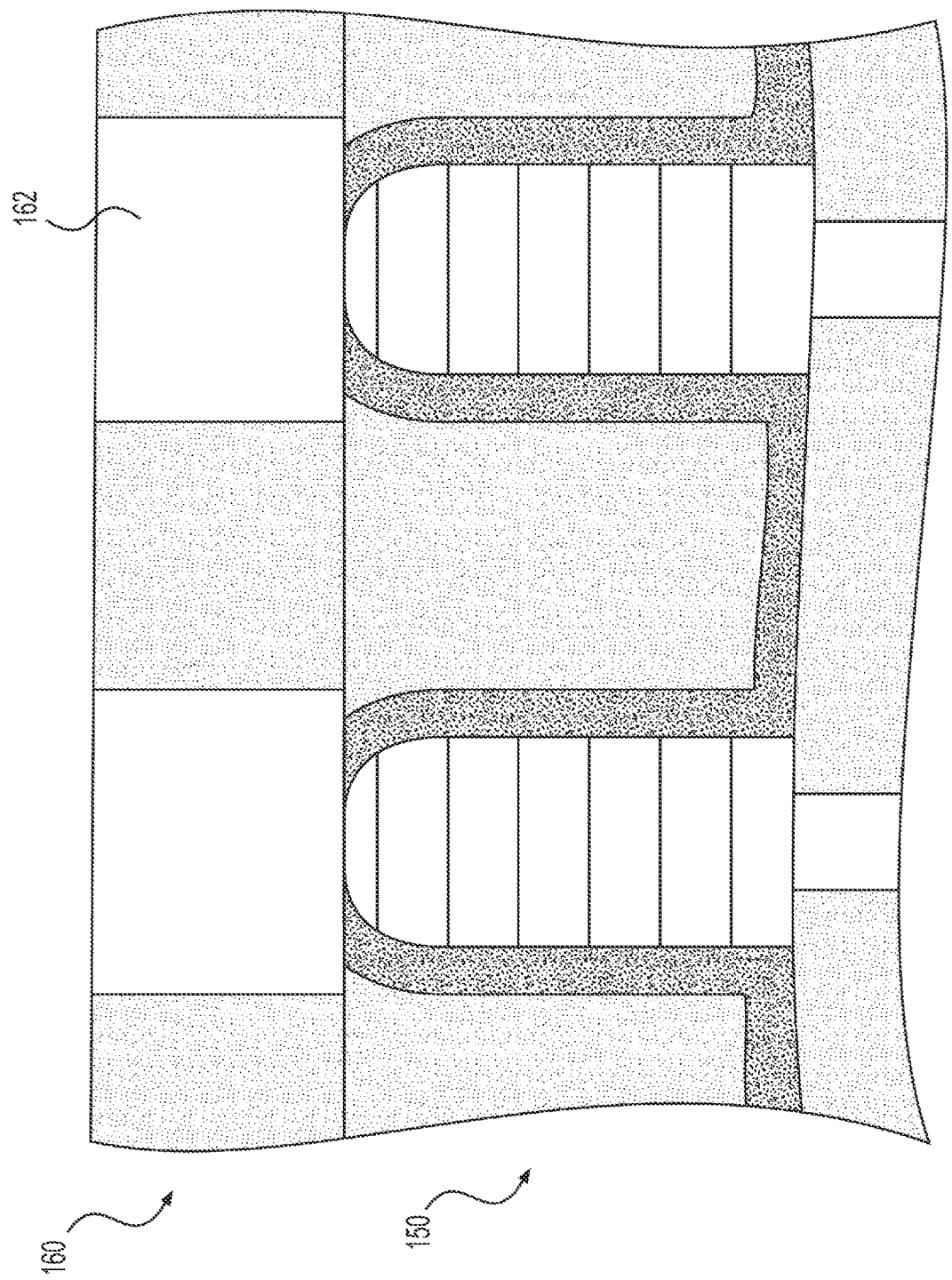
Figure 15A:
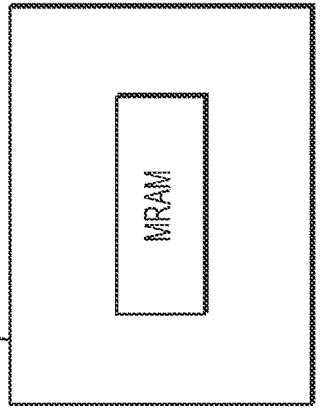
Figure 15B:
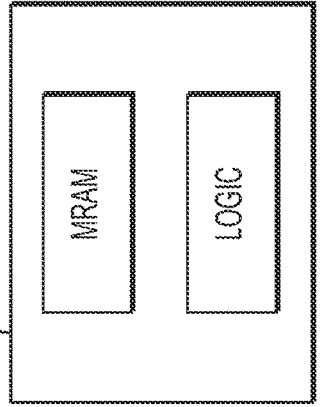
Figure 14:
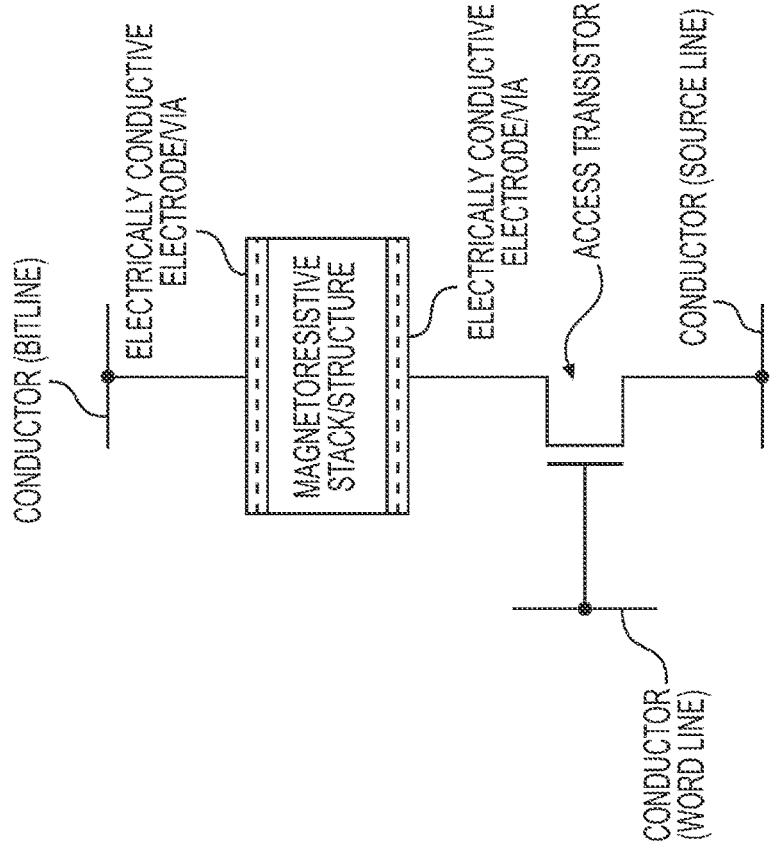
Figure 16:
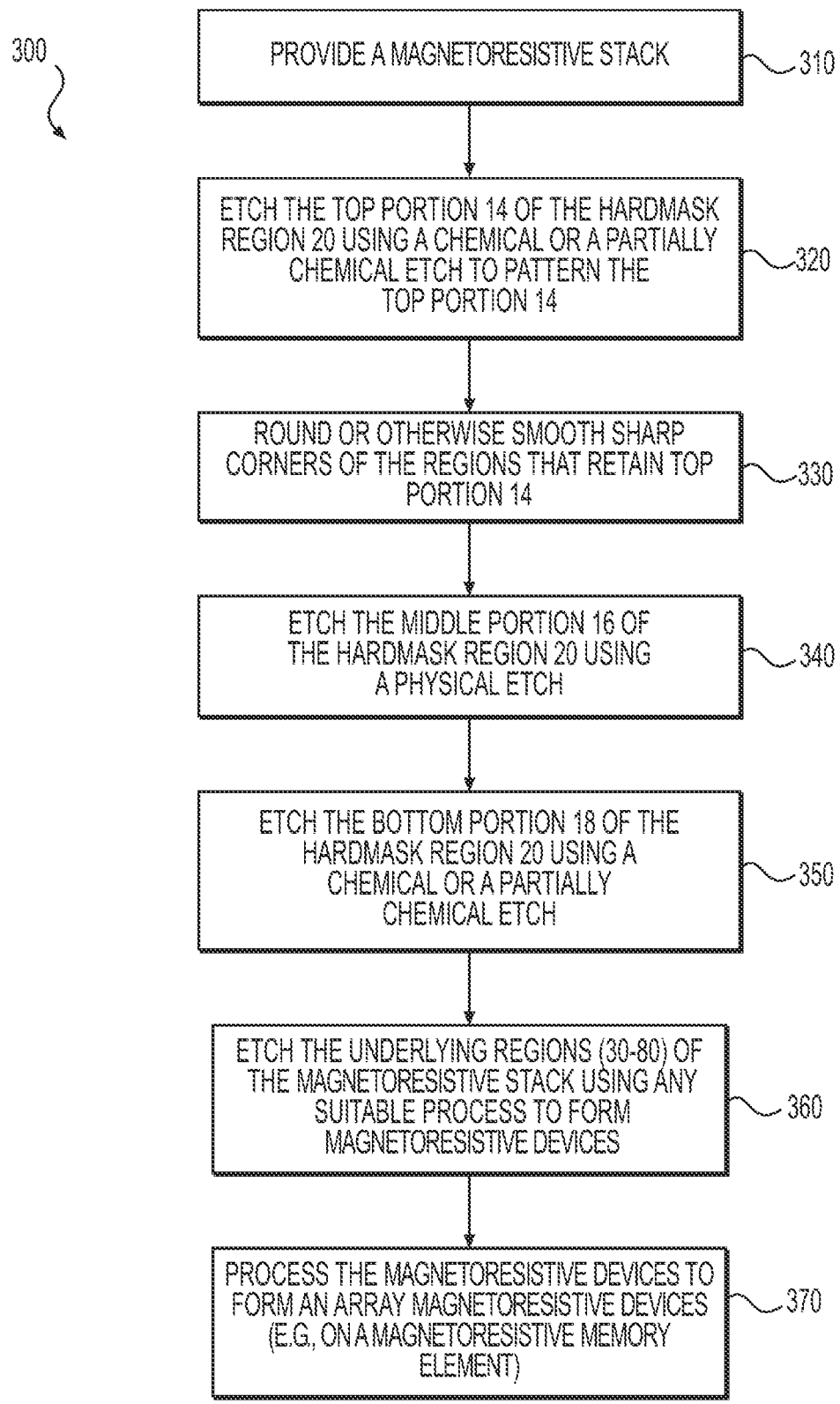

FIG. 1 is a cross-sectional schematic illustration of the structure of an exemplary magnetoresistive stack/structure (magnetoresistive stack) used to form a magnetoresistive device, according to principles of the current disclosure;

FIG. 2 is a cross-sectional schematic illustrating a mask deposited on the magnetoresistive stack of FIG. 1 during processing of the magnetoresistive stack to form a magnetoresistive device;

FIG. 3 is a cross-sectional schematic illustration of the magnetoresistive stack of FIG. 1 after etching exposed portions of the top portion of the hardmask;

FIG. 4 is a plan view of the magnetoresistive stack of FIG. 3 illustrating an exemplary pattern of the top portion formed after the etching process;

FIGS. 5A-5B are plan views of the magnetoresistive stack of FIG. 1 during different stages of an exemplary litho-etch litho-etch process used to form magnetoresistive devices from the magnetoresistive stack;

FIGS. 6A-6D are plan views of the magnetoresistive stack of FIG. 1 during different stages of exemplary multiple litho-etch litho-etch processes used to form magnetoresistive devices from the magnetoresistive stack;

FIGS. 7A and 7B are exemplary plan views of the magnetoresistive stack of FIG. 4 after exemplary processes for rounding the corners of the etched pattern;

FIG. 8 is cross-sectional schematic illustration of the magnetoresistive stack of FIG. 3 after etching exposed portions of a middle portion of an exemplary hardmask;

FIG. 9 is cross-sectional schematic illustration of the magnetoresistive stack of FIG. 8 after etching exposed portions of a bottom portion of the exemplary hardmask;

FIG. 10 is a cross-sectional schematic illustration showing exemplary magnetoresistive devices formed by processing magnetoresistive stack of FIG. 1;

FIG. 11 is a cross-sectional schematic illustration of encapsulated magnetoresistive devices during processing of the magnetoresistive devices of FIG. 10;

FIG. 12 is a cross-sectional schematic illustration of the encapsulated magnetoresistive devices of FIG. 11 after polishing;

FIG. 13 is a cross-sectional schematic illustration of the polished magnetoresistive devices of FIG. 12 after forming bit contact structures thereon;

FIG. 14 is a schematic diagram of an exemplary magnetoresistive device electrically connected in a magnetoresistive memory cell configuration;

FIG. 15A is a schematic block diagram illustrating an exemplary discrete memory device that includes an exemplary magnetoresistive memory element of the current disclosure;

FIG. 15B is a schematic block diagram illustrating an exemplary embedded memory device that includes an exemplary magnetoresistive memory element of the current disclosure; and FIG. 16 is a flow chart that illustrates an exemplary manufacturing flow for the formation of an exemplary an exemplary magnetoresistive device, according to aspects of the present disclosure.

There are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, means the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers of material. That is, a region (as used herein) may include a single layer (or coating) of material or multiple layers or coatings of materials stacked one on top of another to form a multi-layer system. Further, although in the description below, the different regions in the disclosed stack/structure are sometimes referred to by specific names (hardmask region, reference region, transition region, etc.), this is only for ease of description and not intended as a functional description of the layer.

As alluded to above, in one exemplary aspect, the exemplary magnetoresistive devices disclosed in the present disclosure, formed from a magnetoresistive stack/structure fabricated according to the manufacturing principles described herein, may be used in, for example, a magnetic tunnel junction type device (MTJ device). The MTJ device may be implemented, for example, as a spin-torque magnetoresistive random access memory ("MRAM") element ("memory element"), a magnetoresistive sensor, a magnetoresistive transducer, etc. In such aspects, the magnetoresistive stack/structure may include an intermediate region positioned (or sandwiched) between two ferromagnetic regions to form a magnetic tunnel junction. The intermediate region may serve as a tunnel barrier in the MTJ device, and may comprise an insulating material, such as, e.g., a dielectric material. In other embodiments, the magnetoresistive device may include an intermediate region that comprises a conductive material, e.g., copper, gold, or alloys thereof. In these other embodiments, where the magnetoresistive stack/structure includes a conductive material between two ferromagnetic regions/layers, the magnetoresistive stack/structure may form a giant magnetoresistive (GMR) or GMR-type device.

For the sake of brevity, conventional techniques related to semiconductor processing and/or manufacturing of integrated circuits may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist may be applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied so that the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive device from a magnetoresistive stack/structure (magnetoresistive stack). The magnetoresistive stack may include one or more electrically conductive electrodes, vias, or conductors on either side of a magnetic material stack. As described in further detail below, the magnetic material stack may include many different regions of material stacked one on top of another, where some of the regions comprise magnetic materials and other regions do not. In one embodiment, the methods of manufacturing include sequentially depositing, growing, sputtering, evaporating, and/or providing (collectively referred to herein as "depositing" or other verb tense (e.g., "deposit" or "deposited")) layers and regions which, after further processing (for example, etching, etc.), the layers form a magnetoresistive stack/structure.

In some embodiments, the magnetoresistive stacks/structures (referred to herein as magnetoresistive stack) may be formed between a top electrode/via/line and a bottom electrode/via/line and, each of which may permit access to the magnetoresistive stack by allowing for connectivity (for example, electrical) to circuitry and other elements of the magnetoresistive device. Between the electrodes/vias/lines are regions (each comprising, as explained previously, single or multiple layers), including at least one "fixed" magnetic region (which includes, among other things, one or more ferromagnetic layers), at least one "free" magnetic region (which includes, among other things, one or more ferromagnetic layers), and one or more intermediate layers or regions disposed between a "fixed" magnetic region and the "free" magnetic region. In some embodiments, the magnetoresistive stack may include a dielectric material as the intermediate layer. In such embodiments, the magnetoresistive stack may form a magnetic tunnel junction (MTJ) or MTJ-type stack. In other embodiments, the magnetoresistive stack may include a conductive material as the intermediate layer. In such embodiments, the magnetoresistive stack may form a GMR or GMR-type stack. In some embodiments, the top electrode and/or the bottom electrode may be eliminated, and a bit line may be formed on top of the described magnetoresistive stacks.

FIG. 1 illustrates a cross-sectional view of an exemplary magnetoresistive stack/structure 100 (for example, an in-plane or out-of-plane magnetic anisotropy magnetoresistive stack/structure (e.g., a perpendicular magnetic anisotropy magnetoresistive stack/structure)) having multiple regions (20, 30, 40, etc.) formed one on top of another. For the sake of brevity, in the discussion below, the magnetoresistive stack/structure is referred to as a "magnetoresistive stack." It will be recognized that several commonly-used regions (or layers) (e.g., various protective cap layers, seed layers, etc.) have not been illustrated in FIG. 1 (and in subsequent figures) for clarity. Each of the regions (20, 30, 40, etc.) of magnetoresistive stack 100 may comprise one or more layers of material. That is, for example, in some embodiments, region 30 may comprise a single layer of a material (e.g., element, a chemical composition, alloy, composite, etc.) formed on region 40, and hardmask region 20 may comprise multiple layers of materials (in some cases, different materials sequentially formed one atop the other) formed on region 30. In the discussion below, the term "region" is intended to cover both a zone (e.g., a thickness, volume, etc.) comprising a single layer of material (e.g., region 30 in the example above) and a zone comprising multiple layers of material (e.g., region 20 in the example above).

As known to one skilled in the art, the interface between the multiple regions (20, 30, etc.) (and/or the interface between the multiple layers, if any, within a region) may, in some cases, be characterized by compositional (e.g., chemical) and/or structural changes due to intermixing between the materials (or intermetallic formation) of the adjacent regions (e.g., during deposition, post deposition anneal, etc.). For example, while the compositional profile across an ideal interface (e.g., an interface which does not undergo compositional changes) between two regions (or layers) may indicate a sharp profile (e.g., the composition abruptly changes from the composition of one region to that of the other region), the compositional profile across a typical interface of magnetoresistive stack 100 of FIG. 1 may indicate a different profile. For example, the profile may indicate a gradual change in chemical composition across an interface of two regions if intermixing occurs between the materials of the regions, or the profile across the interface may indicate the presence of a different composition in the vicinity of the interface if a different interfacial phase (e.g., an intermetallic) is formed at the interface.

It should be stressed that FIG. 1 only represents the structure of an exemplary magnetoresistive stack 100 used to describe concepts of the current disclosure. As would be recognized by those of ordinary skill in the art, many other magnetoresistive stacks are possible (e.g., standard perpendicular, perpendicular with dual spin filter stack structure, etc.). Some exemplary magnetoresistive stacks are described in, for example, U.S. Pat. Nos. 8,686,484; 8,747,680; 9,136,464; and 9,419,208, each of which is assigned to the assignee of the current application and incorporated by reference in its entirety herein. Each of the magnetoresistive stacks described in the aforementioned patents may be used in connection with the current disclosure. Further, as explained previously, although a magnetoresistive stack is used to describe aspects of the current disclosure, the disclosure is not limited thereto. Instead, the concepts described in the current disclosure may be applied in the fabrication of any integrated circuit device structure.

A magnetoresistive stack 100 having the structure illustrated in FIG. 1 (or any other suitable structure) may be fabricated, by techniques known in the art, in some embodiments, on the backend 90 of an integrated circuit (IC) device (e.g., on the surface of an IC die having electrical circuitry). For example, an electrically conductive region 80 may be first deposited or otherwise provided on the die backend 90 to serve as an electrode that is electrically connected to a metallization region 92 (via, pad, etc.) on the IC device. As known to those of ordinary skill in the art, the metallization region 92 (that extends through an inter-layer dielectric 94) provides electrical contact to circuits of the IC device. In this disclosure, the term "deposited" (and various forms thereof, such as, for example, deposit, depositing, etc.) is broadly used to refer to any currently-used or future-developed IC fabrication process used to lay down (coat, dispose, provide, etc.) a material on a surface (e.g., chemical vapor deposition (CVD), physical vapor deposition (PVD), sputtering, electroplating, electroless plating, growing, etc.). Different regions (e.g., region 70, region 60, region 50, etc. in the order illustrated in FIG. 1) may then be sequentially deposited (i.e., one on top of another) to form the structure of FIG. 1, which after further processing (annealing, etc.), will result in magnetoresistive stack 100. Although FIG. 1 illustrates each region as being deposited directly on its underlying region (e.g., region 30 on region 40, etc.), in some embodiments, one or more intermediate layers/regions (e.g., transition regions, diffusion barriers, seed regions, etc.) may be present between any two interfacing or mating regions (e.g., regions 30 and 40).

Magnetoresistive stack 100 includes intermediate regions 40, 60 (such as, for example, comprised of dielectric material(s) or nonmagnetic conductive materials) deposited on or above magnetic material regions 50 and 70, respectively. In an exemplary magnetoresistive device (e.g., MRAM, etc.), magnetic material region 70 may function as a "fixed" magnetic region, and magnetic material region 50 may function as a "free" magnetic region, and one or both of intermediate regions 40 and 60 may function as tunnel barriers when regions 40 and 60 include a dielectric material. That is, a magnetic moment vector in a "fixed" region 70 does not move significantly in response to applied magnetic fields (e.g., an external field) or applied currents used to switch the magnetic moment vector of "free" region 50. Although regions 50 and 70 are illustrated as a single layer in FIG. 1, each of these regions may comprise several layers of a magnetic or a ferromagnetic material formed one on top of another with, in some cases, additional layers (e.g., an antiferromagnetic coupling layer, a reference layer, a transition layer, etc.) between the layers.

With continuing reference to FIG. 1, hardmask region 20 may be a region that aids in the subsequent processing (e.g., etching) of the magnetoresistive stack 100. As will be described in greater detail below, region 20 may itself comprise different regions (e.g., sequentially arranged along its thickness) that have different rates of etchability relative to a chemical etchant. Some of these regions may be sacrificial regions that are designed to be removed during processing of the magnetoresistive stack 100 to form magnetoresistive devices, e.g., magnetic tunnel junction (MTJ) bits 150 (see FIG. 10). Region 30, which separates hardmask region 20 from intermediate region 40, may function as a spacer or a diffusion barrier region of the magnetoresistive stack 100.

Since materials and geometries (thicknesses, etc.) suitable for the different regions (e.g., regions 30, 40, 50, 60, 70, 80) of magnetoresistive stack 100 are known in the art (e.g., described in U.S. Pat. Nos. 8,686,484; 8,747,680; 9,023,216; 9,136,464; and 9,419,208), they are not described herein. Hardmask region 20 may comprise multiple regions (each of which may include one or more layers) formed one on top of another. For example, hardmask region 20 may include a bottom portion 18 interfacing with region 30, a top portion 14 on the surface of magnetoresistive stack 100, and an intermediate or middle portion 16 in between the top and bottom portions 14, 18. Each of top, middle, and bottom regions 14, 16, 18 may be formed of one or more layers. As will be explained in more detail below, the materials of each of the top, middle, and bottom portions 14, 16, 18 of the hardmask region 20 may be selected to aid in the etching of magnetoresistive stack 100 to form suitable magnetoresistive devices, e.g., MTJ bits 150 (see FIG. 10) having a fine pitch (which may result in a magnetoresistive device having an increased feature density).

In general, some or all of top portion 14, middle portion 16, and bottom portion 18 may be comprised of materials selected to a have different levels of etchability (for example, using a chemical reagent). That is, two of, or all three of, top portion 14, middle portion 16, and bottom portion 18 may be made of materials that have significantly different rates of etching using the same or similar chemical reagent (in any now-known or later-developed etching process, e.g., reactive ion etching). For example, top portion 14 may comprise a material that can be etched relatively easily using the chemical reagent, and middle portion 16 may be made of a material that is not easily etched (or substantially unetched by) by the same or another similar chemical reagent. That is, the middle portion 16 may act as an etch stop during a process designed to etch of top portion 14. Bottom portion 18 may also comprise a material that can be etched relatively easily using the same or another similar chemical reagent. In some embodiments, bottom portion 18 may comprise a material having an etchability profile similar to that of top portion 14. In some embodiments, top portion 14 and bottom portion 18 may comprise the same material(s) and the middle portion 16 may comprise a different material(s).

Top portion 14 of hardmask 20 may include an electrically conductive or nonconductive material that can be etched by a chemical reagent. In some embodiments, top portion 14 may include an electrically nonconductive material, or a dielectric material, such as, for example, TEOS (Tetraethyl orthosilicate), Silicon Nitride ($Si_3N_4$), etc. In some embodiments, top portion 14 may include an electrically conductive material, such as, for example, titanium nitride (TiN), tantalum (Ta), tantalum nitride (TaN), etc. Middle portion 16 may be formed of any material that is resistant to the chemical reagent used to etch top portion 14. In some embodiments, middle portion 16 may be formed of a metal (e.g., a different metal than the metal used to form top portion 14) that has lower etchability (e.g., substantially resistant) to the chemical reagent than the top portion 14. For example, in an embodiment, where the top portion 14 is etched using reactive ion etching (RIE) with the aid of a chemical reagent, such as, for example, fluroform ($CHF_3$) or tetrafluoromethane ($CF_4$), the top portion 14 may comprise TEOS or TiN, and the middle portion 16 may comprise one or more metals that are resistant to $CHF_3$ or $CF_4$, such as, for example, ruthenium (Ru), platinum manganese (PtMn), Iridium Manganese (IrMn), etc.

During fabrication of a magnetoresistive device from the magnetoresistive stack 100, the middle portion 16 may be used as a hardmask to etch the bottom portion 18 (e.g., after the middle portion 16 is patterned with the aid of the top portion 14). And, in the fabricated magnetoresistive device, remaining portions of the bottom portion 18 and/or the middle portion 16 (i.e., portions that remain after fabrication) may serve as an electrode (e.g., the top electrode of a magnetoresistive device). Therefore, the bottom portion 18 may comprise any electrically conductive material having a relatively higher etchability (or less resistance) to a chemical reagent (e.g., the same chemical reagent that was used to etch the top portion 14 or a different chemical reagent) than the middle portion 16. In some embodiments, if the top portion 14 is comprised of an electrically conductive material, the bottom portion 18 may also comprise the same material (or a similar material in terms of chemical etchability) to the top portion 14. In an exemplary embodiment, where the bottom portion 18 is etched using reactive ion etching (RIE) with the aid of a chemical reagent, such as, for example, fluroform ($CHF_3$) or tetrafluoromethane ($CF_4$), the bottom portion 18 may comprise a material, such as, for example, tantalum (Ta), tantalum nitride (TaN), titanium nitride (TiN), etc. As alluded to above, although the described hardmask region 20 is depicted as have multiple layers or regions (e.g., top, middle, and bottom portions 14, 16, and 18), those of ordinary skill in the art will understand that the hardmask region 20 may only include a single layer of a single material.

In general, hardmask region 20 (and its constituent regions—top portion 14, middle portion 16, and bottom portion 18) may have any thickness. As explained previously, each region or portion 14, 16, and 18 of the hardmask region 20 may be used as a hardmask to etch a lower region. Therefore, as would be recognized by those of ordinary skill in the art, the thickness of these portions may be selected to be suitable for this purpose. In some embodiments, the thickness of hardmask region 20 may be in the range of approximately 10-3500 Å (preferably approximately 400-2500 Å, or more preferably approximately 600-1200 Å), the thickness of top portion 14 may be approximately 100-1000

Å (preferably approximately 200-1200 Å, or more preferably approximately 300-600 Å), the thickness of middle portion 16 may be approximately 10-400 Å (preferably approximately 25-250 Å, or more preferably approximately 50-150 Å) thick, and the thickness of bottom portion 18 may be approximately 100-2000 Å (preferably approximately 200-1200 Å, or more preferably approximately 300-600 Å).

During fabrication of a magnetoresistive device, the magnetoresistive stack 100 may be processed to form an array of magnetoresistive devices (e.g., MTJ bit 150 of FIGS. 10-13). Some of these processing operations will be described below.

As illustrated in FIG. 2, for example, a patterned mask 110 may first be formed on a surface of hardmask region 20 to form exposed areas 120 of the hardmask region 20. In general, the exposed areas 120 may correspond to any desired preselected pattern (e.g., a square/rectangular grid pattern, parallel lines, etc.). As will be explained in more detail below, in some embodiments, the pattern of the exposed areas 120 may be selected to decrease the pitch or increase the density of the magnetoresistive devices to be formed from the steps described below. The mask 110 may be formed by any now-known or future-developed technique, including conventional deposition and lithographic techniques. For example, a conventional photoresist may be deposited and patterned (e.g., exposed to a light source through a template, and the exposed/covered regions removed) to form exposed areas 120 on the mask 110. Any suitable material may be used to form mask 110. These materials may include, among others, a conventional photoresist plus a bottom anti-reflective coating (BARC), patterned spin on glass, a silicon containing polymer such as SIHM® (Shin-Etsu Chemical Co., Ltd.), UVAS® (Honeywell International Inc.), spin on carbon, near-frictionless carbon layer (NFC), etc. Since patterning these mask materials to expose selected areas 120 of hardmask region 20 are well known in the art, further discussion is not provided herein.

The uncovered regions of the top portion 14 (of hardmask region 20) at the exposed areas 120 may then be etched to remove the top portion 14 from these areas. In some embodiments, the mask 110 may then be stripped or otherwise removed after etching the top portion 14. In some embodiments, this stripping step may be eliminated, and at least a portion of the mask 110 may remain atop the retained regions the top portion 14. FIG. 3 is schematic cross-sectional illustration of the magnetoresistive stack 100 after the top portion 14 is etched and the mask 110 has been stripped. Any now-known or future developed etching process (e.g., an etching process that uses a chemical reagent (chemical etching or a partial chemical etching, etc.)) may be used to etch and remove the exposed areas of top portion 14. For example, in some embodiments, RIE using $CHF_3$ or $CF_4$ as a reactive chemical species may be used to etch the exposed areas of top portion 14. Since the material of the middle portion 16 is selected to be relatively resistant (or poor etchability) to the chemical reagent used to etch the top portion 14, the middle portion 16 remains substantially unetched during the etching process to remove the exposed portions of top portion 14. That is, the middle portion 16 acts as an etch stop during the etching of the top portion 14.

During the etching process, the pattern of the mask 110 (in FIG. 3) is replicated on the top portion 14. That is, regions of the top portion 14 that are covered by the mask 110 (see FIG. 2) are not etched and the regions of the top portion 14 that are not covered by the mask (e.g., exposed areas 120 in FIG. 2) are etched and removed to expose the middle portion 16. The mask 110 may be patterned to have any shape (a grid of square/rectangular shapes, parallel lines, perpendicular or otherwise orthogonal or angled lines, etc.).

Turning now to FIG. 4, there is illustrated a top view (plan view) of the magnetoresistive stack 100 of FIG. 3. As illustrated in FIG. 4, in some embodiments, the mask 110 (in FIG. 2) may be patterned to leave an array of substantially square-shaped (or substantially rectangular-shaped) islands of the top portion 14 after the etching process. In some embodiments, when the top portion 14 is etched (see FIG. 3), a portion (some or all) of the mask 110 (on the surface of the top portion 14) may also be removed as a result of the etching process. In some embodiments, a portion of the mask 110 may remain on the top portion 14 after the etching process. Although not a requirement, in some embodiments, any remaining mask 110 after the etching process may be stripped or otherwise removed to expose the underlying top portion 14.

After processing, regions of the magnetoresistive stack 100 covered by the top portion 14 (in FIGS. 3 and 4) will form an array of magnetoresistive devices, such as, e.g., MTJ bits 150 (see FIG. 10). As known to those of ordinary skill in the art, the pitch or the spacing (d) between top portions 14 (of the various magnetoresistive devices in the depicted array) is limited by parameters associated with the lithographic process (wavelength of light, etc.) used to form mask 110. As known to those of ordinary skill in the art, decreasing the spacing (d) below certain limits (imposed by the lithographic process) may detrimentally affect the critical dimensions of the retained structure. For improved performance of a magnetic memory element having an array of magnetoresistive devices, for example, it is desirable to decrease the spacing (d) (in FIG. 4) so as to increase the density of the resulting magnetoresistive devices in the magnetic memory element. As will be described in more detail below, in some embodiments, to decrease the spacing between the magnetoresistive devices, a multi-step etching process (such as, for example, litho-etch litho-etch (or LELE)) may be used to etch the top portion 14.

FIGS. 5A and 5B illustrate an exemplary LELE process that may be used in some embodiments or aspects of the present disclosure. In a first litho-etch (or LE) step, a mask 110 is deposited on the surface of hardmask region 20 and patterned to form exposed areas 120 (see, e.g., FIG. 2) in the form of a series of spaced-apart parallel strips extending in the horizontal direction of FIGS. 5A and 5B. The magnetoresistive stack 100 may then be etched (using the same process described previously or any other suitable process) to remove the top portion 14 from the exposed areas 120. After this first litho-etch step (or LE step), as illustrated in FIG. 5A, the retained top portion 14 and the exposed middle portion 16 (below the etched areas of the top portion 14) form parallel strips that extend in the horizontal direction. After optionally stripping any remaining mask 110 from the surface of hardmask region 20, a second litho-etch step then may be performed (on the patterned structure of FIG. 5A) by depositing and patterning a second mask 110 to form exposed areas 120 that form spaced-apart parallel strips extending in the vertical direction (i.e., in a direction perpendicular to the direction of the first etching step described above in this paragraph). After this step, some areas of the top portion 14 that were covered by the mask 110 during the first litho-etch step will be exposed (e.g., regions marked A in FIG. 5B). The magnetoresistive stack 100 is etched again to etch these newly uncovered regions of the top portion 14. In some embodiments, any remaining portions of the second mask 110 is thereafter stripped. In some embodiments, this step may be eliminated, and the second mask 110 may remain.

FIG. 5B illustrates the magnetoresistive stack 100 after the second litho-etch step. As illustrated in FIG. 5B, after the LELE process, an array of square-shaped (or rectangular-shaped) top portions 14 is retained on the magnetoresistive stack 100 similar to that in FIG. 4. However, as will be recognized by those of ordinary skill in the art, forming the horizontally oriented and vertically oriented exposed areas 120 separately, significantly improves the photo-contrast ratio (e.g., normalized image log-slope or NILS, etc.) during the lithographic process, and also allows tuning the photo illumination (during lithography) to each orientation separately (e.g., dipole illumination) for further contrast ratio increase. Further, as would be recognized by a person skilled in the art, a magnetoresistive device has a regular pattern that lends itself well to separating horizontal and vertical patterning. As a result of these and other improvements, the spacing ($d_1$) (see FIG. 5B) between the retained top portions 14 (and the resulting magnetoresistive devices) after the LELE process will be smaller than the spacing (d) after the single litho-etch process of FIG. 4. Further, since the horizontally oriented and vertically oriented exposed areas 120 are formed separately in the LELE process, any misalignment between the resulting exposed areas does not affect the size of the magnetoresistive device. Due to the two litho-etch steps of the LELE process, some regions of the middle portion 16 (e.g., region marked B in FIG. 5B) are subject to etching twice. However, because of the high etch selectivity of hardmask region 20 (i.e., the top portion 14 has relatively high etchability while the middle portion 16 has a relatively low etchabilty), the LELE process can be applied to etch the top portion 14 without creating deeper holes or pits at these double-etched regions or junctions. As one of ordinary skill in the art would recognize, such deeper holes and/or pits may become defects that trap material (e.g., veil material, etc.) during further processing of magnetoresistive stack 100, thereby potentially leading to electrical shorting.

To further decrease the spacing between the magnetoresistive devices in the array (e.g., the array depicted in FIG. 4), in some embodiments, the horizontally aligned and the vertically aligned exposed regions may each be formed using multiple litho-etch steps. That is, while a single litho-etch step was used to form the horizontal pattern of FIG. 5A, and a subsequent single litho-etch step was used to form the vertical pattern of FIG. 5B, multiple litho-etch steps may be used to form each of the horizontal and vertical patterns. For example, in some embodiments, as illustrated in FIGS. 6A-6D, the horizontally aligned exposed regions may be formed by two litho-etch steps (see FIGS. 6A and 6B), and the vertically aligned exposed regions may be formed by two litho-etch steps (see FIGS. 6C and 6D).

Figure 6A:
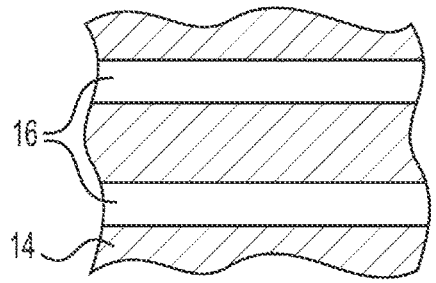
Figure 6B:
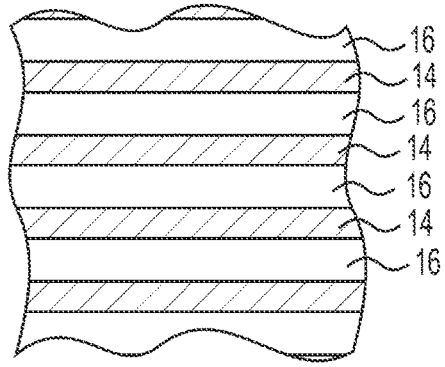
Figure 6C:
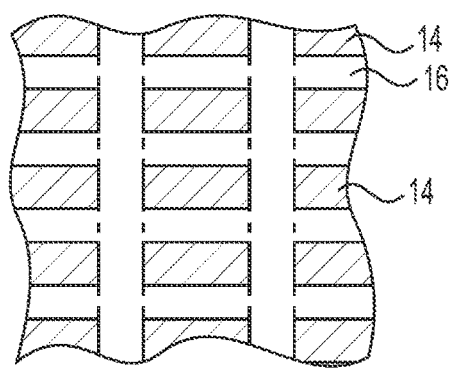
Figure 6D:
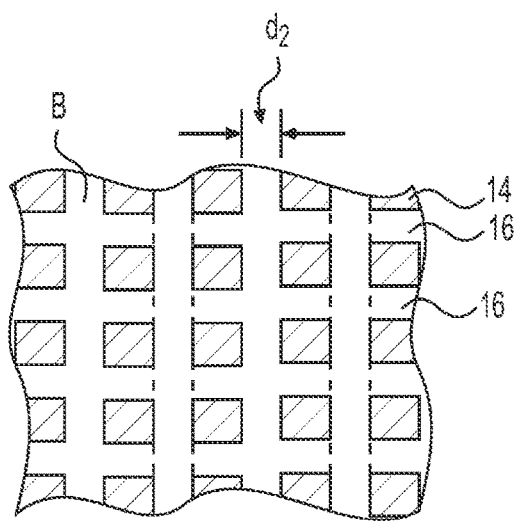

Specifically, after depositing a mask 110, patterning the deposited mask 110 to form exposed regions 120 (see FIG. 2) that are aligned in the horizontal direction, the top portion 14 at the exposed regions 120 is etched to form a first set of horizontally aligned strips of top portions 14 at a first pitch separated by strips of exposed middle portions 16 (see FIG. 6A). After the mask 110 optionally is stripped, another mask 110 may be deposited and patterned to form a second set of horizontally aligned exposed areas spaced apart from the first horizontally aligned exposed middle portions 16 (see FIG. 6B). The top portions 14 visible through the resulting exposed areas is then etched to form a second set of horizontally aligned top portions 14 separated from the first set of horizontally aligned top portions 14 (see FIG. 6B).

The resulting array of magnetoresistive devices of FIG. 6B may again be similarly litho-etched in two steps (see FIGS. 6C and 6D) with masks having exposed regions aligned in the vertical direction (i.e., perpendicularly to the direction of the first etching processes described earlier in this paragraph). That is, a first vertical etch may be performed followed by a second vertical etch offset from the location of the first vertical etch. The intersection of the horizontal and vertical patterns create roughly an array of square- or rectangular-shaped top portions 14 separated by exposed middle portions 16. As would be recognized by those of ordinary skill in the art, the spacing ($d_2$) between the retained top portions 14 (and the resulting magnetoresistive devices) after the multiple LELE processes of FIGS. 6A-6D will be smaller than the spacing ($d_1$) after the single LELE process of FIGS. 5A-5B. Further, because of the high etch selectivity of the various portions of hardmask region 20, the multiple LELE processes can be applied to etch the top portion 14 without creating deeper holes at regions of the middle portion 16 which are subject to etching multiple times (marked B in FIG. 6D).

With renewed reference to FIG. 4, as explained previously, after processing of the magnetoresistive stack, each of the regions remaining covered by top portion 14 will form a single magnetoresistive device, as explained in greater detail below. Sharp corners of the regions retaining top portion 14 (in FIG. 4) may therefore result in magnetoresistive devices with similar sharp corners. In some cases, these sharp corners in the magnetoresistive devices may detrimentally affect the performance of device magnetoresistive memory element formed from such magnetoresistive devices (e.g., the sharp corners may act as domain nucleation sites and affect the magnetic performance of the magnetoresistive devices and/or the result magnetoresistive memory element). Therefore, in some embodiments, the regions retaining top portion 14 in FIG. 4 may be etched to remove the sharp corners by a rounding process. Etching the regions retaining top portion 14 (FIG. 4), for example, without the mask 110 atop the corners, may etch these corners to provide rounding of the corners. In some embodiments, the etching process that is used to etch the top portion 14 (e.g., see FIG. 2) may be continued for a longer time (than is necessary to etch the top portion 14 in the exposed areas 120) to round the sharp corners of the resulting array of top portions 14. That is, if RIE is used to etch the top portion 14, the RIE process may be continued (to round off the corners of the retained top portions 14) for an additional time even after the middle portion 16 is exposed in the etched areas. The additional time that the etching process is continued depends upon the application, and may be determined through experimentation. In some embodiments, as illustrated in FIG. 7A, for example, the etching process may be continued only until the apex of one or more corners of each region retaining top portion 14 is rounded. In other embodiments, as illustrated in FIG. 7B, the etching process may be continued until the entire region retaining top portion 14 is rounded into a circular or oval configuration when viewed from above. In some embodiments, after the array of regions retaining top portion 14 is first formed (e.g., as in FIGS. 4, 5B, 6D, etc.), any residual mask 110 remaining on the top portions 14 may be stripped before rounding off the corners by continued etching. In some embodiments, the mask 110 may be stripped only after the rounding step. In some embodiments, however, the mask 110 may not be stripped even after the rounding step.

After the top portion 14 of hardmask region 20 is patterned in the manner described above (e.g., forming an array of regions retaining top portion 14, as illustrated in FIG. 4), the patterned top portion 14 may then be used to etch the region below (i.e., the middle portion 16). FIG. 8 illustrates the top region of the magnetoresistive stack 100 after the middle portion 16 is etched through the exposed areas 120 of the patterned top portion 14. Since, in some embodiments, the material of the middle portion 16 is generally resistant (or includes a relatively low etchability) to chemical etches, the middle portion 16 may be etched using a physical etching process using the patterned top portion 14 as a mask. Any now-known or future developed physical etching (or dry etching) technique (e.g., sputter etching, ion beam etching, etc.) may be used to etch (or ablate) the middle portion 16. Since physical etching techniques are well known in the art, they are not described herein in greater detail. As illustrated in FIG. 8, during the etching process, a portion of the top portion 14 (which, as explained earlier, is used as a mask during the etching) may also be removed. Although not illustrated in FIG. 8, if there is any amount of mask 110 remaining (from the etching of the top portion 14) on the top portion 14, some or all of this mask 110 may also be removed by the physical etching process of middle portion 16. The physical etching may be continued until the bottom portion 18 of hardmask region 20 is detected at the exposed areas 120. The bottom portion 18 may be detected during the etching process by any method. For example, in some embodiments, during the etching process, the material of the bottom portion 18 may be detected using optical emission spectra (OES). That is, the physical etching process used to remove the middle portion 16 may be terminated when a rise in OES signal for the material of the bottom portion 18 is detected. In this step, the pattern of the top portion 14 is replicated on the middle portion 16. That is, by the physical etching process, the middle portion 16 of hardmask region 20 is patterned.

The patterned middle portion 16 may then be used to etch the bottom portion 18 of the hardmask region 20. FIG. 9 illustrates the top region of the magnetoresistive stack 100 after the bottom portion 18 is etched. The bottom portion 18 may be etched by any chemical or partial chemical etching process that selectively etches the bottom portion 18 relative to the middle portion 16. In some embodiments, the same etching process used to etch the top portion 14 may be used to etch the bottom portion 18. For example, in some embodiments, RIE using $CHF_3$ or $CF_4$ as a reactive chemical species may be used to etch the bottom portion 18. Since the material of the middle portion 16 is resistant to these chemicals, in some embodiments, the patterned middle portion 16 may remain substantially unetched during the etching process for bottom portion 18. It is also contemplated that, in some embodiments, as illustrated in FIG. 9, a portion of the middle portion 16 may also be removed while etching the bottom portion 18. As further illustrated in FIG. 9, in embodiments where the bottom portion 18 also is etched by the chemical species used to etch the top portion 14, any material of top portion 14 remaining prior to the etching process of bottom portion 18 (see FIG. 8) may also be removed (or reduced) during this etching. In some embodiments, the material of region 30 may substantially resistant (or has low etchability) to the chemical species used to etch the bottom portion 18. In these embodiments, the etching will terminate at region 30. That is, region 30 will act as an etch stop during the etching of the bottom portion 18. Additionally or alternatively, in some embodiments, techniques such as, for example, OES (described previously) may be used to terminate the etch at region 30.

After the bottom portion 18 of hardmask region 20 is patterned as described above, the patterned middle and bottom portions 16 and 18 may thereafter be used as a mask to etch the lower regions (e.g., regions 30, 40, 50, etc.) of the magnetoresistive stack 100 to form an array of magnetoresistive devices, e.g., MTJ bits 150. FIG. 10 illustrates MTJ bits 150 formed by etching the multiple regions of the magnetoresistive stack 100 using the middle and bottom portions 16 and 18 of hardmask region 20 as a mask. In some embodiments, as illustrated in FIG. 10, a portion of the bottom portion 18 and the middle portion 16 may also be removed (ablated, etched, etc.) while etching the underlying regions of the stack. In some embodiments, the bottom portion 18 and/or the middle portion 16 may not be removed. In some embodiments, substantially all, or a significant portion of, the middle portion 16 may be removed as a result of the etching. Since the bottom portion 18 may serve as an electrode of the formed MTJ bits 150, in some embodiments, the etching process may be controlled to minimize the removal of the bottom portion 18. Any now-known or future developed process may be used to etch regions 30-80 of the magnetoresistive stack 100. In some embodiments, regions 30-80 may be etched in one etching step. For example, an etching technique such as, for example, ion beam etching, RIE, etc. may be used to etch through the entire thickness of the magnetoresistive stack 100, exposed through the patterned middle and bottom portions 16 and 18, in one etching operation. In some cases, debris (e.g., nonvolatile byproducts of the multiple regions that are removed or ablated by the etching process) may redeposit on the sidewalls of the formed MTJ bits 150 after the etching, to form a veil of electrically or magnetically conductive material. This debris can cause shorts between the different regions, and may therefore be removed after the etching process. Any process, such as, for example, angled etch, etc. may be used to remove the debris from the side walls.

In some embodiments, a multi-step etching process may be used to etch through the underlying regions (i.e., regions 30-80) of magnetoresistive stack 100. For example, in some embodiments, some of the regions (e.g., regions 30-50) may be etched in a first etching step and the side walls cleaned (using, for example, angled etch) after this etching step. An encapsulant (e.g., silicon nitride, silicon oxide, etc.) may then be deposited on the partially formed and cleaned MTJ bits (using, for example, chemical vapor deposition (CVD), atomic layer deposition (ALD), etc.) to enacapsulate these structures, and the remaining regions (e.g., regions 60-80) may then be etched in a second etch step to form the entire MTJ bits 150. It is also contemplated that, in some embodiments, the etching process used to etch the bottom portion 18 of the hardmask region 20 (see FIG. 9) may not be terminated at region 30. Instead, this etching process may be continued and used to etch additional regions (e.g., some or all of the regions 30, 40, etc.) of the magnetoresistive stack 100. That is, in some embodiments, the same etching process used to etch the bottom portion 18 (i.e., using the middle portion 16 as a mask) may be used to etch through some or all of the underlying regions of the magnetoresistive stack 100.

As illustrated in FIG. 11, after the MTJ bits 150 are formed as described above, a first encapsulant 130 (formed of a material, such as, for example, silicon nitride, silicon oxide, etc.) may be deposited on the formed MTJ bits 150, and a second encapsulant 140 (formed of an inter-layer dielectric (ILD) material, such as, for example, TEOS or a low-K ILD such as, for example, SiCOH, fluorinated silicates glasses (FSG), organosilica glasses (OSG), etc. may be deposited over the encapsulated MTJ bits 150. The encapsulated magnetoresistive stack 100 of FIG. 11 may then be polished (and, in some embodiments, etched) to expose the top electrically conductive surface of the MTJ bits 150. FIG. 12 is an illustration of the magnetoresistive stack 100 after the polishing. Since such polishing processes are well known in the art, they are not described herein. The magnetoresistive stack 100 may be polished to expose the middle portion 16 (if any middle portion 16 remains on the bits) or the bottom portion 18 of the MTJ bits 150. In some embodiments, as illustrated in FIG. 12, the exposed top surface on some of the MTJ bits 150 may be the middle portion 16 while the exposed top surface on other MTJ bits 150 may be the bottom portion 18. After exposing an electrically conductive surface of the formed MTJ bits 150, a bit contact structure 160 may be formed on the magnetoresistive stack to make electrical contact with the MTJ bits 150. FIG. 13 illustrates a magnetoresistive stack 100 with an exemplary bit contact structure 160 formed thereon. The bit contact structure 160 may include electrically conductive elements 162 that make contact with the MTJ bits 150 and interconnect these bits in a desired configuration to form device magnetoresistive device, such as, e.g., a magnetoresistive memory element. Any type of bit contact structure where a conductive element 162 (e.g., trench, via, or logic metal layer, etc.) is used to contact the exposed conductive region (e.g., middle portion 16 or bottom portion 18) of the MTJ bits 150 may be used. Since such structures are known in the art, they are not described here in greater detail.

As alluded to above, the magnetoresistive devices (formed using aforementioned described techniques and/or processes) may include a sensor architecture or a memory architecture (among other architectures). For example, in a magnetoresistive device having a memory configuration, the magnetoresistive devices, e.g., MTJ bits 150, may be electrically connected to an access transistor and configured to couple or connect to various conductors, which may carry one or more control signals, as shown in FIG. 14. The magnetoresistive devices may be used in any suitable application, including, e.g., in a memory configuration. In such instances, the magnetoresistive devices may be formed as integrated circuits comprising a discrete memory device (e.g., as shown in FIG. 15A) or an embedded memory device having a logic therein (e.g., as shown in FIG. 15B), each including MRAM, which, in one embodiment is representative of one or more arrays of MRAM having a plurality of magnetoresistive devices formed magnetoresistive stacks/structures, according to certain aspects of certain embodiments disclosed herein.

An exemplary method of fabricating a selected embodiment of a magnetoresistive device will now be described. It should be appreciated that the described method is merely exemplary. In some embodiments, the method may include a number of additional or alternative steps, and in some embodiments, one or more of the described steps may be omitted. Any described step may be omitted or modified, or other steps added, as long as the intended functionality of the magnetoresistive device remains substantially unaltered. Although a certain order is described or implied in the described method, in general, the steps of the described method need not be performed in the illustrated and described order. Further, the described method may be incorporated into a process of fabricating a magnetoresistive memory or sensor element using the magnetoresistive devices fabricated according to principles of the present disclosure. Additionally, the described method may be incorporated into a more comprehensive procedure or process having additional functionality not described herein.

FIG. 16 depicts a flow chart of an exemplary method 300 of fabricating one or more magnetoresistive devices from an MTJ stack. For the sake of brevity, the method will describe fabricating a magnetoresistive device, such as, e.g., an MTJ bit 150, from magnetoresistive stack 100 (of FIG. 1), referencing previously described aspects (materials, fabrication processes, dimensions, etc.) of these embodiments. However, as described previously, the current disclosure may be applied to any magnetoresistive stack (e.g., dual spin filter MTJ stack, etc.), including devices based on magnetic tunnel junction or giant magnetoresistive technologies. A magnetoresistive stack may first be provided (step 310). Providing the magnetoresistive stack may include sequentially depositing (and/or growing, sputtering, etc.) the multiple regions of the magnetoresistive stack 100, and processing (e.g., annealing, etc.) these deposited regions to form magnetoresistive stack 100. In some embodiments, this step may include using a magnetoresistive stack 100 that was previously formed. The magnetoresistive stack 100 includes a top hardmask region 20 that comprises a chemical etch resistant material (middle portion 16) sandwiched on either side by chemically etchable materials (e.g., top portion 14 and bottom portion 18). In general, the material on the exposed top side of the etch resistant material (e.g., top portion 14) may be electrically conductive or nonconductive (e.g., TiN, TEOS, etc.), while the material on the bottom side of the etch resistant material (i.e., bottom portion 18) may be electrically conductive (e.g., Ta, TaN, TiN, etc.) so that it can serve as a conductor of the formed magnetoresistive device. The etch resistant middle portion 16 of the hardmask region 20 may include any material that is relative inert to the chemical reagent used in the etch (e.g., Ru, PtMn, etc.) processes described herein.

The top portion 14 of the hardmask region 20 is then etched in a chemical or a partially chemical etch process (e.g., RIE, etc.) to pattern the top portion 14 in a desired pattern (step 320). In some embodiments, this step may include using known lithographic techniques (single litho-etch, multiple litho-etch (e.g., LELE), etc.) to expose selected regions of the top portion 14 and then etching the exposed regions to form islands of regions that retain top portion 14 separated by the exposed middle portion (see FIG. 4). Etching may be performed using any suitable chemical (or partially chemical) technique (for example, reactive ion beam etching using $CHF_3$ and/or $CF_4$, as the chemical species). Since the middle portion 16 of the hardmask region 20 is relatively resistant to the chemical component of the etch, it acts as an etch stop. In some embodiments, sharp corners of the regions retaining top portion 14 (see FIG. 4) may then be rounded (see, for example, FIGS. 7A and 7B) by etching (e.g., continuing the etching of the top portion 14 for a longer time), for example, without a mask over the corners (step 330). In some embodiments, step 330 may be eliminated.

Using the patterned top portion 14 as a mask, the middle portion 16 of the hardmask region 20 is then etched using a physical etch (e.g., sputter etch) to transfer the pattern to the middle portion 16 (step 340). A portion (some or all) of the top portion 14 may also be ablated and removed during this physical etch step (see FIG. 8). Using the patterned middle portion 16 as a mask, the bottom portion 18 of the hardmask region 20 may then be etched using a chemical (or a partially chemical) etching process to pattern the bottom portion 18 (step 350) (see FIG. 9). Any suitable chemical or partially chemical technique (for example, reactive ion beam etching using $CHF_3$ and/or $CF_4$, as the chemical species) may be used for this etching. In fact, the process used to etch bottom portion 18 may be the same or substantially similar to the process used to etch top portion 14. Some portions of the top and middle portions 14 and 16 of the hardmask region 20 may also be removed during this etching. However, since the middle portion 16 is relatively inert to the chemical etchant, a significant portion of the middle portion 16 will be retained after the etching. The multiple underlying regions (regions 30-80 of FIG. 1) of the magnetoresistive stack 100 may then be etched using the patterned middle and bottom portions 16 and 18 as a mask to form magnetoresistive devices, such as, e.g., MTJ bits 150 (step 360) (see FIG. 10). Any suitable etching process (ion beam etching, RIE, etc.) may be used to etch the multiple regions of the magnetoresistive stack 100. And, the multiple regions may be etched in one etching step, or in multiple etching steps with, in some embodiments, one or more cleaning (e.g., debris removal from the sidewalls of the MTJ bits) and encapsulations steps in between. Further processing may then be carried out on the MTJ bits 150 to form an array of magnetoresistive devices, e.g., a magnetoresistive memory element (step 370). This step may include, for example, depositing one or more encapsulants on the formed MTJ bits 150 (see FIG. 11), polishing the encapsulated MTJ bits to expose a conductive region of the MTJ bits (see FIG. 12), and forming a suitable bit contact structure to electrically connect with the MTJ bits. Since processes to form an MTJ device from the MTJ bits are well known in the art, they are not discussed in more detail herein.

In one embodiment, a method of fabricating a magnetoresistive bit from a magnetoresistive stack is disclosed. The magnetoresistive stack may include at least two magnetic regions, an intermediate region positioned between two magnetic regions of the at least two magnetic regions, and a surface region. The method may include (a) etching through at least a portion of a thickness of the surface region to create a first set of exposed areas in the form of multiple strips extending in a first direction; and (b) etching through at least a portion of a thickness of the surface region to create a second set of exposed areas in the form of multiple strips extending in a second direction. The first set of exposed areas and the second set of exposed areas may have multiple areas that overlap. The method may also include, (c) after the etching in (a) and (b), etching through at least a portion of the thickness of the magnetoresistive stack through the first set and second set of exposed areas.

Various embodiments of the disclosed method may alternatively or additionally include the following aspects: the first set of exposed areas may include multiple substantially parallel strips that extend in the first direction, and the second set of exposed areas may include multiple substantially parallel strips that extend in the second direction; the first set of exposed areas may include multiple strips arranged substantially parallel to and spaced substantially equidistant from each other, and the second set of exposed areas may include multiple strips arranged substantially parallel to and spaced substantially equidistant from each other, wherein the first direction is transverse to the second direction; creating the first set of exposed areas may include creating a first plurality of substantially parallel strips extending in the first direction, and creating a second plurality of substantially parallel strips extending in the first direction, wherein the parallel strips of the second plurality of substantially parallel strips are substantially equally spaced apart from the parallel strips of the first plurality of substantially parallel strips; (i) creating the first set of exposed areas may include creating a first plurality of substantially parallel strips that are substantially equally spaced apart and extend in the first direction, creating a second plurality of substantially parallel strips that are substantially equally spaced apart and extend in the first direction, wherein each parallel strip of the second plurality of substantially parallel strips may be positioned between two parallel strips of the first plurality of substantially parallel strips, and (ii) creating the second set of exposed areas may include creating a third plurality of substantially parallel strips that are substantially equally spaced apart and extend in the second direction, and creating a fourth plurality of substantially parallel strips that are substantially equally spaced apart and extend in the second direction, wherein each parallel strip of the fourth plurality of substantially parallel strips may be positioned between two parallel strips of the third plurality of substantially parallel strips.

Various embodiments of the disclosed method may alternatively or additionally also include the following aspects: the surface region may include multiple stacked layers; the surface region may include a first layer disposed over a second layer, wherein the first layer has a higher etch rate than the second layer; the surface region may include a first layer having a higher etch rate to a chemical reagent disposed over a second layer having a lower etch rate to the chemical reagent, wherein the etching in (a) and (b) may include etching through the first layer of the surface region using an etching process that utilizes the chemical reagent; the surface region may include a first layer having a higher etch rate to a chemical reagent disposed over a second layer having a lower etch rate to the chemical reagent, wherein the etching in (a) and (b) may include etching through the first layer of the surface region, and the etching in (c) may include etching through at least the second layer of the surface region; the surface region may include a first layer disposed above a second layer and a third layer disposed below the second layer, wherein the first and the third layers may have a higher etch rate than the second layer; the etching in (a) and (b) may be an etching process utilizing a chemical reagent, and the etching in (c) may be a physical etching process.

In another embodiment, a method of fabricating a magnetoresistive bit from a magnetoresistive stack is disclosed. The magnetoresistive stack may include at least two magnetic regions, an intermediate region positioned between two magnetic regions of the at least two magnetic regions, and a multi-layer surface region. The method may include (a) etching through at least a portion of a thickness of the surface region to create a first set of exposed areas in the form of a plurality of substantially parallel strips extending in a first direction, (b) etching through at least a portion of a thickness of the surface region to create a second set of exposed areas in the form of a plurality of substantially parallel strips extending in a second direction transverse to the first direction, and (c) after the etching in (a) and (b), etching through at least a portion of the thickness of the magnetoresistive stack through the first set and second set of exposed areas.

Various embodiments of the disclosed method may alternatively or additionally include the following aspects: the multi-layer surface region may include at least a first layer disposed over a second layer, the first layer may have a higher etch rate than the second layer to a same chemical reagent, wherein the etching in (a) and (b) may include etching through the first layer; the multi-layer surface region may include at least a first layer disposed over a second layer, the first layer may have a higher etch rate than the second layer to a same chemical reagent, wherein (i) the etching in (a) and (b) may include, etching through the first layer using an etching process utilizing the chemical reagent, and (ii) the etching in (c) includes etching through the second layer using a physical etching process; (i) the etching in (a) and (b) may uses reactive ion etching, and (ii) the etching in (c) may use ion beam etching; the multi-layer surface region may include a first layer disposed above a second layer and a third layer disposed below the second layer, wherein the first and the third layers may have a higher etch rate than the second layer to a same chemical reagent; the multi-layer surface region may include a first layer disposed above a second layer, wherein, after the etching in (a) and (b), the first layer may form an array of substantially square or substantially rectangular shapes; the multi-layer surface region may include a first layer disposed above a second layer, wherein, after the etching in (a) and (b), the first layer may form an array of substantially square or substantially rectangular shapes, and the method may also include further etching the first layer to smooth at least some of the corners of the substantially square or substantially rectangular shapes.

In yet another embodiment, a method of fabricating a magnetoresistive bit from a magnetoresistive stack is disclosed. The magnetoresistive stack may include at least two magnetic regions, an intermediate region positioned between two magnetic regions of the at least two magnetic regions, and a surface region including at least a first layer having a higher etch rate to a chemical reagent disposed over a second layer having a lower etch rate to the chemical reagent. The method may include (a) etching through the first layer of the surface region using an etching process utilizing the chemical reagent to create a first set of exposed areas in the form of a plurality of substantially parallel strips that are substantially equally spaced apart and extending in a first direction; (b) etching through the first layer of the surface region using an etching process utilizing the chemical reagent to create a second set of exposed areas in the form of a plurality of substantially parallel strips that are substantially equally spaced apart and extending in a second direction transverse to the first direction, and (c) after the etching in (a) and (b), etching through at least the second layer using a physical etching process through the first set and second set of exposed areas.

Various embodiments of the disclosed method may alternatively or additionally include the following aspects: (i) creating the first set of exposed areas may include creating a first plurality of substantially parallel strips that are substantially equally spaced apart and extend in the first direction, creating a second plurality of substantially parallel strips that are substantially equally spaced apart and extend in the first direction, wherein each parallel strip of the second plurality of substantially parallel strips may be positioned between two parallel strips of the first plurality of substantially parallel strips, and (ii) creating the second set of exposed areas may include creating a third plurality of substantially parallel strips that are substantially equally spaced apart and extend in the second direction, and creating a fourth plurality of substantially parallel strips that are substantially equally spaced apart and extend in the second direction, wherein each parallel strip of the fourth plurality of substantially parallel strips may be positioned between two parallel strips of the third plurality of substantially parallel strips.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating a magnetoresistive bit from a magnetoresistive stack including at least two magnetic regions, an interfacing region, at least two intermediate regions, an electrically conductive region, and a hardmask region, the method comprising:
   (a) etching through at least a portion of the hardmask region to expose the interfacing region, wherein the hardmask region is disposed over the interfacing region;
   (b) after the etching in step (a), etching through the interfacing region, a first intermediate region of the at least two intermediate regions, and a first magnetic region of the at least two magnetic regions to expose a first set of areas in a first direction, wherein the interfacing region is disposed over the first intermediate region and the first intermediate region is disposed over the first magnetic region;
   (c) after the etching in step (b), etching through the interfacing region, the first intermediate region, and the first magnetic region to expose a second set of areas in a second direction;
   (d) after the etching in step (c), etching through a second intermediate region of the at least two intermediate regions, a second magnetic region of the at least two magnetic regions, and the electrically conductive region to expose a third set of areas in the first direction, wherein the second intermediate region is disposed over the second magnetic region and the second magnetic region is disposed over the electrically conductive region; and
   (e) after the etching in step (d), etching through the second intermediate region, the second magnetic region, and the electrically conductive region to expose a fourth set of areas in the second direction.

2. The method of claim 1, wherein the first direction is transverse to the second direction.

3. The method of claim 1, wherein the first set of areas is spaced substantially equidistant from each other and the second set of areas is spaced substantially equidistant from each other.

4. The method of claim 1, wherein the first set of areas is spaced substantially equidistant from each other and the third set of areas is spaced substantially equidistant from each other.

5. The method of claim 1, after the etching in steps (b)-(e), the magnetoresistive bit forms an array of substantially square or substantially rectangular shapes.

6. The method of claim 1, wherein the hardmask region includes a thickness in a range of approximately 600-1200 Å.

7. The method of claim 1, the hardmask region including a first layer, a second layer, and a third layer, wherein the first layer is disposed over the second layer and the first layer has a higher etch rate than the second layer.

8. The method of claim 7, wherein the first layer having a higher etch rate to a chemical reagent is disposed over the second layer having a lower etch rate to the chemical reagent.

9. The method of claim 8, wherein etching through the first layer of the hardmask region uses a chemical etching or a partially chemical etching, and wherein etching through at least the second layer of the hardmask region uses a physical etching.

10. The method of claim 8, wherein the third layer is disposed below the second layer, and wherein the first layer and the third layer have a higher etch rate to the chemical reagent than the second layer.

11. The method of claim 1, wherein the first direction is perpendicular to the second direction.

12. A method of fabricating a magnetoresistive bit from a magnetoresistive stack including a first magnetoresistive stack layer, a second magnetoresistive stack layer, and a multi-layered surface region, the method comprising:
   (a) etching through at least a portion of the multi-layered surface region to expose a mating region of the first magnetoresistive stack layer;
   (b) after the etching in step (a), etching through the first magnetoresistive stack layer to expose a first set of multiple parallel strips extending along a first direction, wherein the first magnetoresistive stack layer including the mating region adjacent to the multi-layered surface region, a free magnetic region, and a first intermediate region disposed between the mating region and the free magnetic region;
   (c) after the etching in step (b), etching through the first magnetoresistive stack layer to expose a second set of parallel strips extending along a second direction;
   (d) after the etching in step (c), etching through the second magnetoresistive stack layer to expose a third set of multiple parallel strips extending along the first direction, wherein the second magnetoresistive stack layer includes a second intermediate region, a fixed magnetic region disposed below the second intermediate region, and an electrically conductive region disposed below both the second intermediate region and the fixed magnetic region; and
   (e) after the etching in step (d), etching through the second magnetoresistive stack layer to expose a fourth set of parallel strips extending along the second direction.

13. The method of claim 12, wherein the multi-layered surface region includes a first layer disposed over a second layer, the first layer having a higher etch rate than the second layer to a same chemical reagent.

14. The method of claim 12, wherein the etching in step (a) includes etching through a first layer using an etching process utilizing a chemical reagent and etching through a second layer using a physical etching process.

15. The method of claim 12, wherein the first direction is perpendicular to the second direction.

16. The method of claim 13, wherein the multi-layered surface region further includes a third layer disposed below the second layer, and wherein the first layer and the third layer have a higher etch rate than the second layer to the same chemical reagent.

17. The method of claim 12, wherein, after the etching in steps (b)-(e), the magnetoresistive bit forms an array of substantially square or substantially rectangular shapes.

18. The method of claim 12, wherein, after the etching in step (a), the first magnetoresistive stack layer and the second magnetoresistive stack layer are etched using a mask comprising a remaining portion of the multi-layered surface region.

19. The method of claim 12, wherein the multi-layered surface region includes a thickness in a range of approximately 600-1200 Å.

20. The method of claim 12, wherein the first direction is perpendicular to the second direction.

* * * * *